US008935133B1

(12) United States Patent
Berg et al.

(10) Patent No.: US 8,935,133 B1
(45) Date of Patent: Jan. 13, 2015

(54) MEASUREMENT POINTS IN MODELING AND SIMULATION

(75) Inventors: Joel Berg, Bolton, MA (US); Venkata Tamminana, Westborough, MA (US); Jagadish Gattu, Westborough, MA (US)

(73) Assignee: The MathWorks, Inc., Natick, MA (US)

( * ) Notice: Subject to any disclaimer, the term of this patent is extended or adjusted under 35 U.S.C. 154(b) by 306 days.

(21) Appl. No.: 13/430,056

(22) Filed: Mar. 26, 2012

(51) Int. Cl.
*G06F 17/50* (2006.01)

(52) U.S. Cl.
USPC ............ 703/2; 703/4; 703/6; 703/14; 703/19; 716/136

(58) Field of Classification Search
USPC ............................. 703/2, 4, 19, 14, 6; 716/136
See application file for complete search history.

(56) References Cited

U.S. PATENT DOCUMENTS

| | | | | |
|---|---|---|---|---|
| 4,878,179 A | * | 10/1989 | Larsen et al. | 716/136 |
| 7,315,805 B2 | * | 1/2008 | Slater | 703/19 |
| 7,584,082 B2 | * | 9/2009 | Orofino, II | 703/6 |
| 7,788,476 B2 | * | 8/2010 | McNutt et al. | 713/1 |
| 7,827,017 B2 | * | 11/2010 | Kundert | 703/14 |
| 8,065,683 B2 | * | 11/2011 | Sato et al. | 718/106 |
| 8,245,179 B2 | * | 8/2012 | Inoue | 716/136 |
| 2003/0046045 A1 | * | 3/2003 | Pileggi et al. | 703/4 |
| 2009/0319578 A1 | * | 12/2009 | Orofino, II | 707/201 |

OTHER PUBLICATIONS

Co-pending U.S. Appl. No. 13/538,868 entitled "Synchronization and Data Review System", by Orofino II, filed Jun. 29, 2012, 40 pages.
Working with Test Points: Working with Signals (Simulink®); Retrieved online at: http://www.mathworks.com/help/toolbox/simulink/ug/f15-109572.html; print date: Mar. 26, 2012; 2 pages.

* cited by examiner

*Primary Examiner* — Thai Phan
(74) *Attorney, Agent, or Firm* — Harrity & Harrity, LLP

(57) ABSTRACT

A computing device may be used to create a model that includes a block. The block may represent a function corresponding to a simulation. Measurement points may be inserted into the model. The model may be used to create a simulation, and the measurement points may be used to measure operational characteristics corresponding to the block.

48 Claims, 15 Drawing Sheets

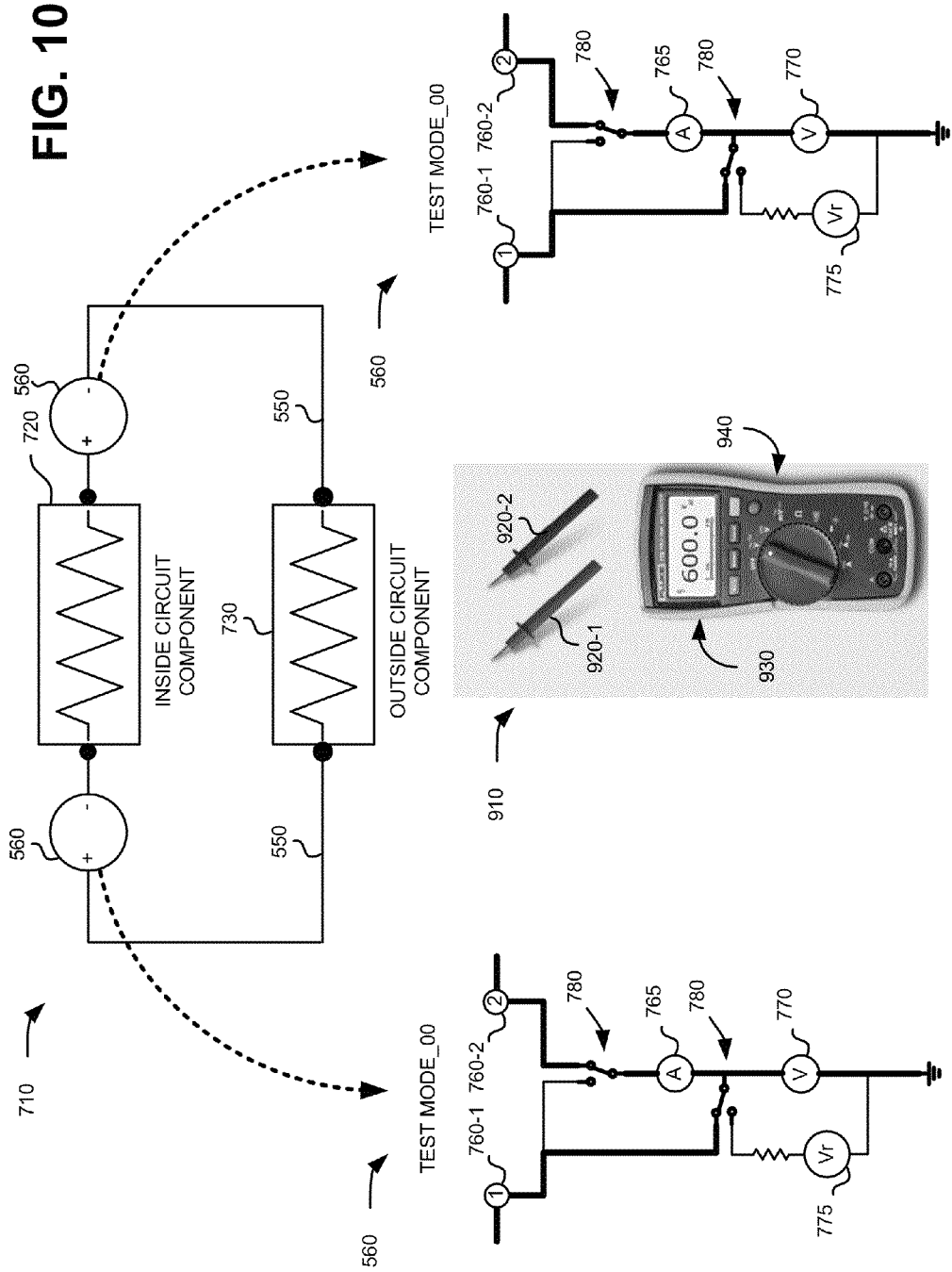

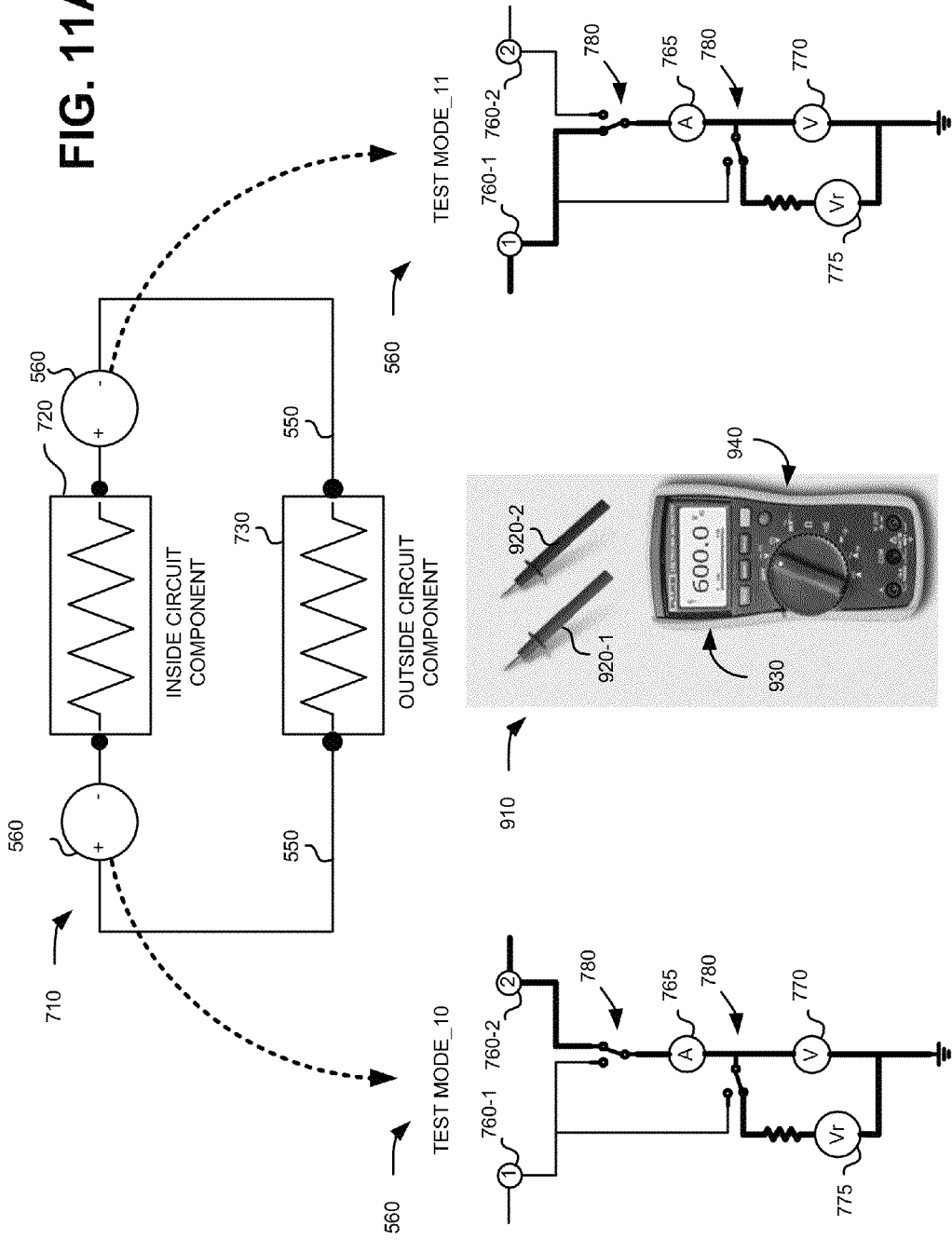

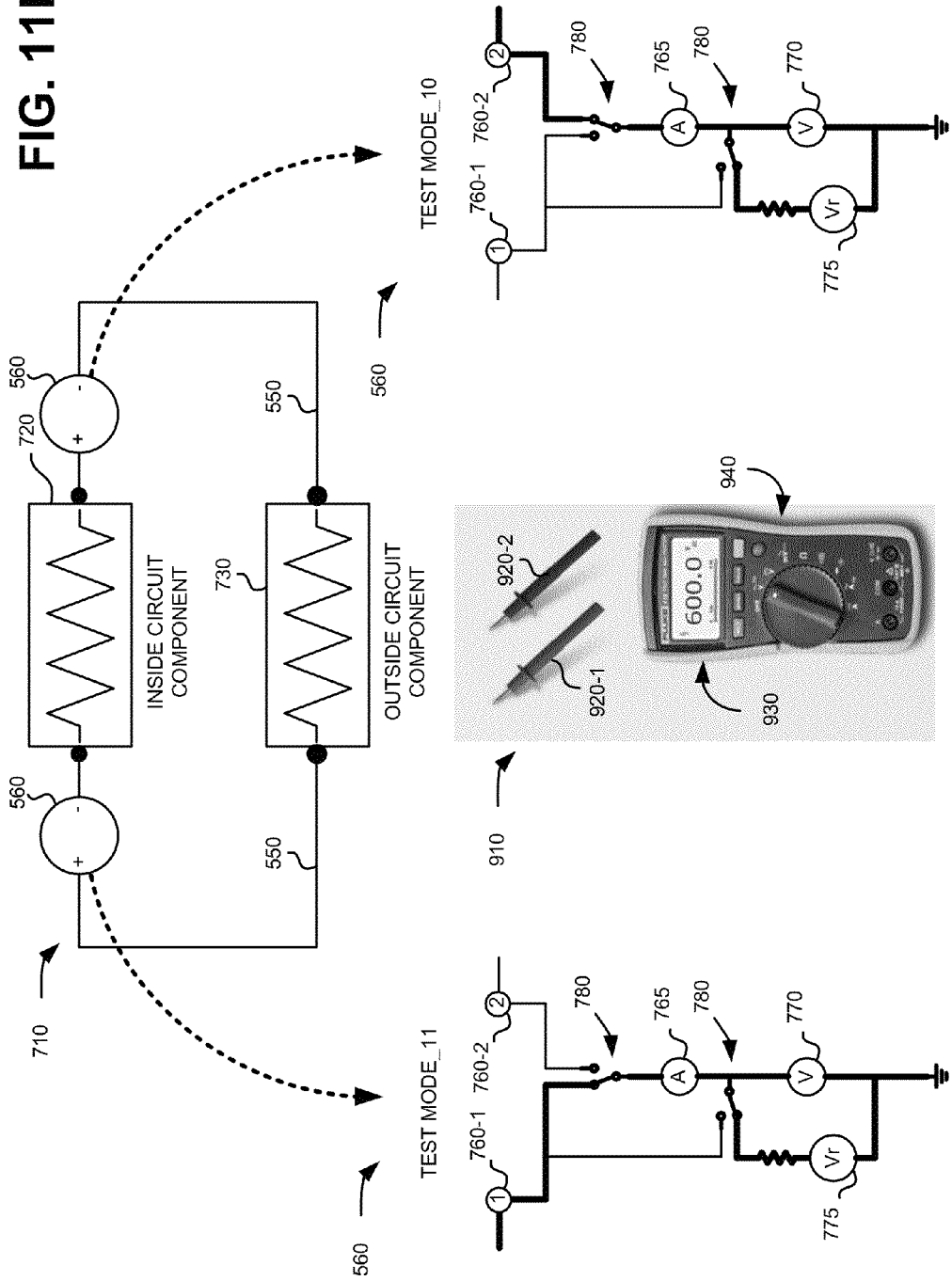

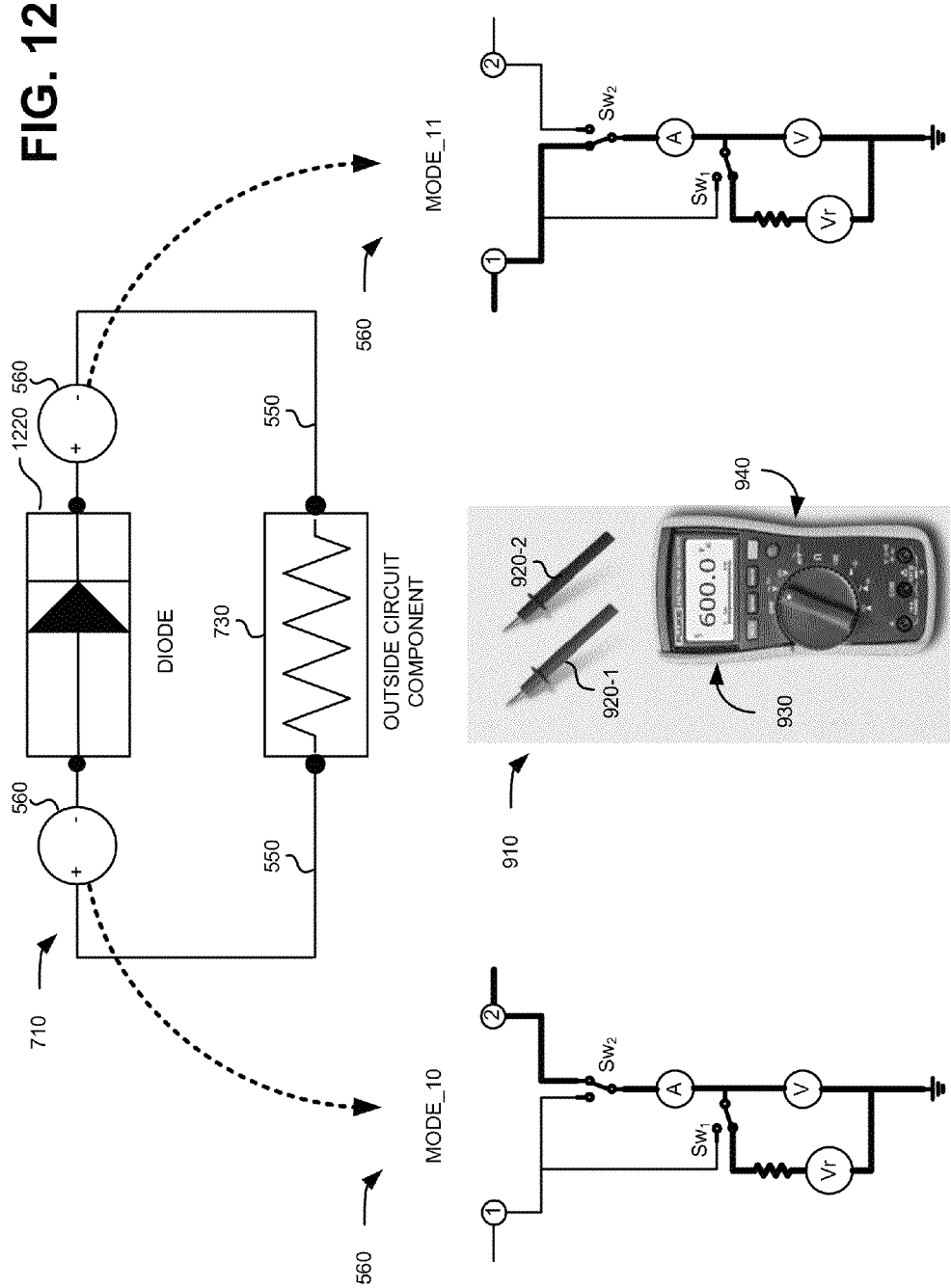

MEASUREMENT POINTS IN MODELING AND SIMULATION

BRIEF DESCRIPTION OF THE DRAWINGS

FIGS. 9-12 are diagrams of example models according to one or more implementations described herein;

DETAILED DESCRIPTION OF PREFERRED EMBODIMENTS

The following detailed description refers to the accompanying drawings. The same labels and/or reference numbers in different drawings may identify the same or similar elements.

A block diagram may represent a system. A device may simulate the system by executing the block diagram. However, currently available technologies for simulating systems do not include adequate solutions for testing, measuring, or otherwise evaluating the performance of one or more of the components of the block diagram during a simulation.

An example implementation, described herein, includes a user device that enables a user to create a model (e.g., a block diagram model) corresponding to a particular system, device, process, etc. Based on the model, the user device may be used to create a simulation that operates in a manner consistent with the particular system, device, process, etc. In some examples, the user device may be connected to, or otherwise include, an additional device, which may enhance or help create the simulation. For instance, the user device may be connected to an electronic circuit board and an electronic probe, which the user may interact with to communicate with the user device and engage with the simulation. The model may include measurement points that may enable a user to measure a condition, a behavior, a characteristic (e.g., an operational characteristic), etc., of the simulation.

Figure 1:
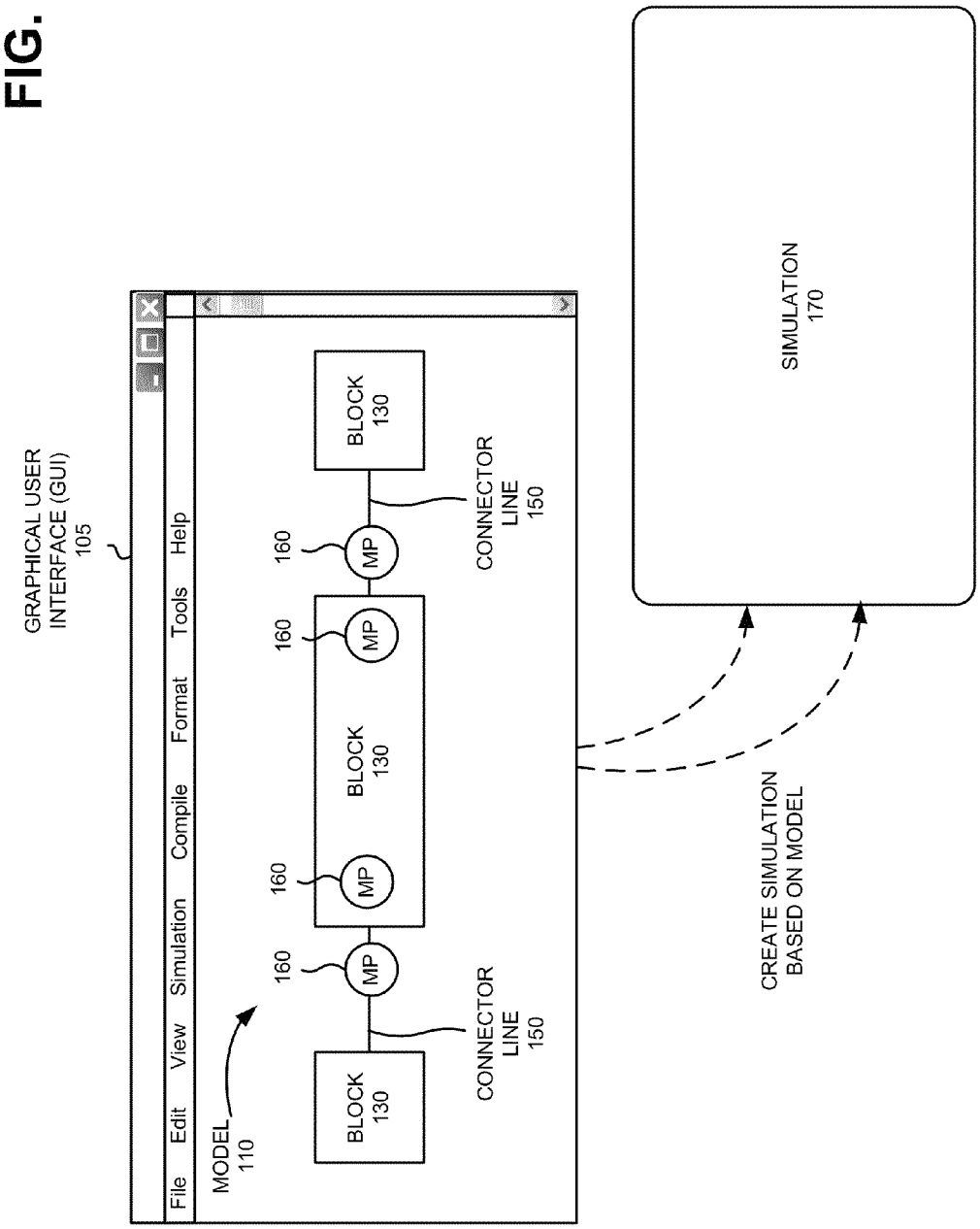
FIG. 1 is a diagram of an example overview of an implementation described herein.

FIG. 1 is a diagram of an example overview of an implementation described herein. As depicted, the overview may include a graphical user interface (GUI) 105, a model 110, blocks 130, connector lines 150, measurement points (MPs) 160, and a simulation 170. GUI 105 may be provided to enable a user to create model 110. Model 110 may provide a visual and/or functional representation of a system, a device, a process, an operation, a feature, or a mechanism corresponding to a discipline or a domain (e.g., mathematics, science, engineering, medicine, economics, business, etc.). For instance, model 110 may correspond to an electrical circuit, a hydraulic system, an internal combustion engine, etc. As such, model 110 may include model components, such as blocks 130, that are interconnected by the connector lines 150. Model 110 components (e.g., blocks 130) may each perform a function depending on the nature of the model component and the model as a whole. Connector lines 150 may represent signal values.

Model 110 may be used to create the simulation based on the functionality of blocks 130, connector lines 105, etc. In one example, blocks 130 may include one or more electrical circuit components (e.g., relays, connectors, switches, etc.) and/or other types of components (e.g., an electrical motor) used in operating an elevator door, and model 110 may be used to create simulation 170 of the elevator door and/or the electrical circuit components represented by blocks 130.

In some implementations, simulation 170 may be created directly within GUI 105 used to create model 110, while in other implementations, model 110 may also, or alternatively, be used to create an executable data structure that may be used to generate simulation 170. The data structure may also, or alternatively, be provided to another device (e.g., analog hardware, digital hardware, etc.) to enable the other computing device to create the simulation. In some implementations, simulation 170 may include, for example, a GUI generated by a user device (e.g., a desktop computer). In other implementations, simulation 170 may also include one or more devices (e.g., a motor, an electronic circuit board, and electronic probes or other measuring devices) connected to, and capable of communicating with, the user device providing the GUI.

Additionally, or alternatively, model 110 may include measurement points 160. Measurement points 160 may enable measurements to be taken with respect to a function, a process, an operation, a behavior, or another type of characteristic (e.g., an operational characteristic) corresponding to a given block 130 or a group of blocks 130. Continuing with the example described above, where blocks 130 correspond to electrical circuit components, measurement points 160 may enable a user to take a measurement corresponding to an electrical current, an electrical potential, an electrical resistance, an electrical continuity, a component integrity, or another type of characteristic corresponding to blocks 130. In some implementations, such measurements may be performed within simulation 170. Accordingly, an implementation described herein provides solutions for creating a model, providing a simulation based on the model, and measuring characteristics corresponding to the simulation.

Furthermore, in implementations described herein, measurement points 160 may be configured and reconfigured, by the user, to test for different characteristics. For instance, a user may configure measurement point 160 to measure an electrical current corresponding to a particular block 130, and later reconfigure the same measurement point 160 to measure another characteristic (e.g., electrical potential) corresponding to the same block 130. As such, implementations described herein provide solutions for taking multiple, distinct measurements using the same measurement points 160.

Figure 2:
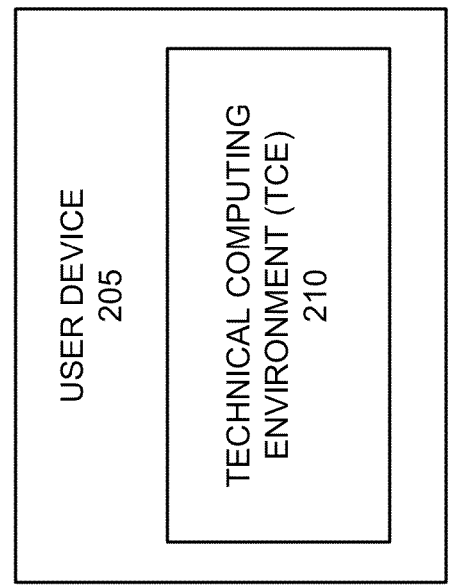
FIG. 2 is a diagram of an example environment in which systems and/or methods, described herein, may be implemented.

FIG. 2 is a diagram of an example environment 200 in which systems and/or methods, described herein, may be implemented. As illustrated, environment 200 may include a user device 205. While FIG. 2 includes a particular device, in alternative implementations, environment 200 may include additional devices, different devices, or differently arranged devices than depicted in FIG. 2.

User device 205 may include a computational device. For example, user device 205 may include a server, a workstation, a mainframe, a computer (e.g., a desktop computer, a laptop computer, a tablet computer, etc.), and/or some other type of computational device. As illustrated in the example of FIG. 2, user device 205 may include a technical computing environment (TCE) 210.

TCE 210 may include hardware-based logic and/or a combination of hardware and software-based logic that provides a computing environment. The computing environment may permit a user to perform tasks related to a discipline or a domain. For example, the computing environment may pertain to mathematics, science, engineering, medicine, business, and/or another type of discipline or domain.

TCE 210 may include a dynamically typed language (e.g., a dynamically typed programming language) that can be used to express problems and/or solutions in mathematical notations. For example, TCE 210 may use an array as a basic element, where the array may not require dimensioning. In addition, TCE 210 may perform matrix and/or vector formulations that can be used for data analysis, data visualization, application development, modeling, algorithm development, simulation, training, testing, etc. These matrix and/or vector formulations may be used in many areas, such as statistics, finance, image processing, signal processing, control design, life sciences, education, discrete event analysis and/or design, state based analysis and/or design, etc.

TCE 210 may further provide mathematical functions and/or graphical tools (e.g., for creating plots, surfaces, images, models, volumetric representations, etc.). In an implementation, TCE 210 may provide these functions and/or tools using toolboxes (e.g., toolboxes for signal processing, image processing, data plotting, parallel processing, etc.). Additionally, or alternatively, TCE 210 may provide these functions as blocks or block sets. Additionally, or alternatively, TCE 210 may provide these functions in another way, such as via a catalog or a library. For example, in some implementations, an array of blocks may be provided in a library (e.g., a model library) that a user may use to identify and/or include a block in a given model.

TCE 210 may include a user interface for creating, compiling, executing, analyzing, transforming, validating, etc., a model of a system. TCE 210 may provide one or more environments for modeling the system. For example, TCE 210 may include a graphical-based environment, a textual-based environment, and/or a hybrid environment (e.g., a combination of graphical and textual environments).

TCE 210 may connect, access, and/or interface with other software applications, data, devices, and/or other types of resources during a modeling process and/or a simulation process. For instance, in some implementations, user device 205 may include, or be in communication with, one or more devices (e.g., an electronic circuit, a particular type of measurement device or sensor device, a power source, etc.) that may assist in developing a particular model and/or producing a particular simulation (e.g., a simulated environment) corresponding to the particular model. As such, user device 205 and/or TCE 210 may include a wide variety of systems and devices.

Examples of devices that may be connected and/or in communication with the user device to create the simulation include a multimeter, an oscilloscope, a spectrum analyzer, a logic analyzer, a protocol analyzer, a bit error rate tester, or data acquisition hardware. A multimeter may be used to, for example, measure a voltage corresponding to the simulation, a current corresponding to the simulation, or a resistance corresponding to the simulation. An oscilloscope may be used to, for example, measure a voltage, corresponding to the simulation, over a period of time, measure the period of a periodic signal corresponding to the simulation, measure a rise time corresponding to the simulation, or measure an overshoot corresponding to the simulation. A spectrum analyzer may be used to, for example, measure a signal frequency corresponding to the simulation, measure a signal magnitude corresponding to the simulation, measure a harmonic corresponding to the simulation, or measure a bandwidth corresponding to the simulation. A logic analyzer may be used to, for example, obtain performance data corresponding to the simulation. A protocol analyzer may be used to, for example, obtain communication channel information corresponding to the simulation. A bit error rate tester may be used to, for example, measure a signal quality of a transmission corresponding to the simulation. A counter may be used to, for example, obtain event information corresponding to a particular event corresponding to the simulation. Data acquisition hardware may be used to, for example, detect a physical condition corresponding to the simulation and/or produce a digital signal corresponding to the physical condition.

Figure 3:
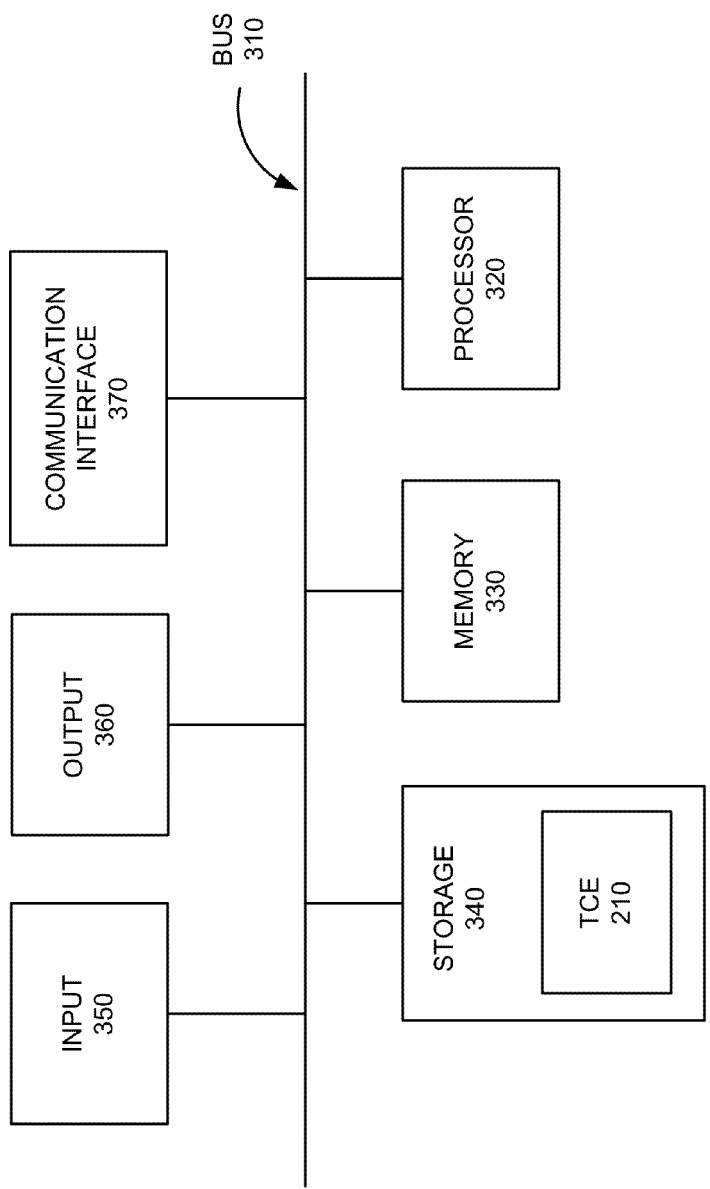
FIG. 3 is a diagram of example components of a user device of FIG. 2.

FIG. 3 is a diagram of example components of user device 205 according to one or more implementations described herein. As shown in FIG. 3, user device 205 may include bus 310, processor 320, memory 330, storage 340, input 350, output 360, and/or communication interface 370. In other implementations, user device 205 may include fewer components, additional components, different components, and/or a different arrangement of components than those depicted in FIG. 3. Additionally, or alternatively, a component of user device 205 may perform an act described as being performed by another component of user device 205.

Bus 310 may permit communication among the other components of user device 205. For example, bus 310 may include a system bus, an address bus, a data bus, and/or a control bus. Bus 310 may also include bus drivers, bus arbiters, bus interfaces, and/or clocks.

Processor 320 may interpret and/or execute instructions. For example, processor 320 may include a general-purpose processor, a microprocessor, a data processor, a graphical processing unit (GPU), co-processors, a network processor, an application specific integrated circuit (ASICs), an application specific instruction-set processor (ASIP), a system-on-chip (SOC), a system-in-package (SiP), a controller, a programmable logic device (PLD), a chipset, and/or a field programmable gate array (FPGA).

Memory 330 may store data and/or instructions related to the operation and use of user device 205. For example, memory 330 may store data and/or instructions that may be configured to implement an implementation described herein. Memory 330 may include, for example, a random access memory (RAM), a dynamic random access memory (DRAM), a static random access memory (SRAM), a synchronous dynamic random access memory (SDRAM), a ferroelectric random access memory (FRAM), a read only memory (ROM), a programmable read only memory (PROM), an erasable programmable read only memory (EPROM), an electrically erasable programmable read only memory (EEPROM), and/or a flash memory.

Storage 340 may store data and/or software related to the operation and use of user device 205. For example, storage 340 may include a hard disk (e.g., a magnetic disk, an optical disk, a magneto-optic disk, a solid state disk), a compact disc (CD), a digital versatile disc (DVD), a floppy disk, a cartridge, a magnetic tape, and/or another type of computer-readable medium, along with a corresponding drive. Memory 330 and/or storage 340 may also include a storing device external to and/or removable from user device 205, such as a Universal Serial Bus (USB) memory stick, a hard disk, etc. In an implementation, as illustrated, storage 340 may store TCE 210.

Input 350 may permit the user and/or another device to input information into user device 205. For example, input 350 may include a keyboard, a keypad, a touchpad, a mouse, a display (e.g., a touch screen), a button, a switch, a microphone, voice recognition logic, an input port, and/or some other type of input component. Output 360 may permit user device 205 to output information to the user and/or another device. For example, output 360 may include a display, a speaker, a light emitting diode (LED), a haptic feedback device, a tactile feedback device, an output port, and/or some other type of output component.

Communication interface 370 may permit user device 205 to communicate with other devices, networks, and/or systems. Communication interface 370 may include a transceiver-like component. For example, communication interface 370 may include an Ethernet interface, an optical interface, a coaxial interface, a radio interface, and/or some other type of wireless and/or wired interface.

As will be described in detail below, user device 205 may perform certain operations relating to implementations described herein. User device 205 may perform these operations in response to processor 320 executing software instructions (e.g., computer program(s)) contained in a computer-readable medium, such as memory 330 and/or storage 340. A computer-readable medium may be defined as a non-transitory memory device. A memory device may include space within a single physical memory device or spread across multiple physical memory devices. The software instructions may be read into memory 330 from another computer-readable medium, such as storage 340, or from another device via communication interface 370. The software instructions contained in memory 330 may cause processor 320 to perform processes described herein. Alternatively, hardwired circuitry may be used in place of or in combination with software instructions to implement processes described herein. Thus, implementations described herein are not limited to any specific combination of hardware circuitry and software.

Figure 4:
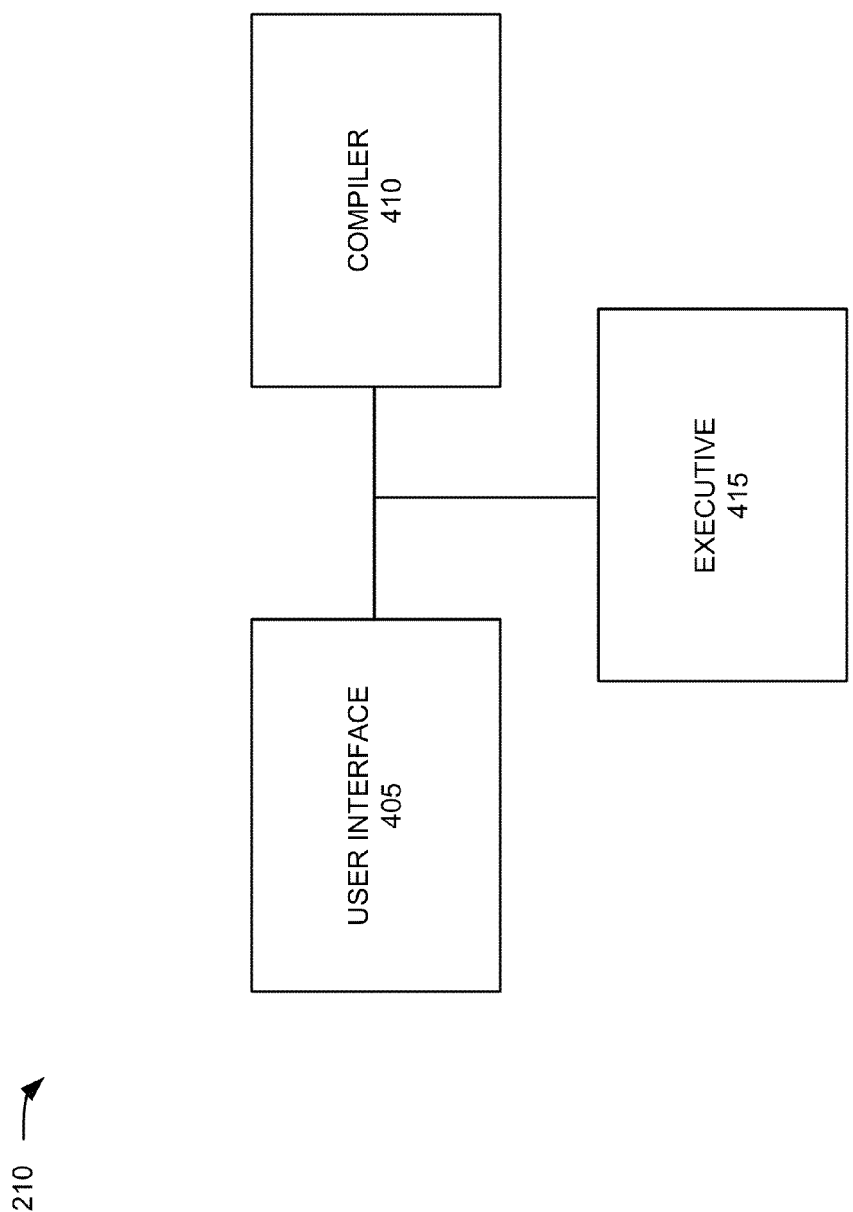
FIG. 4 is a diagram of example functional components of a device according to one or more implementations described herein.

FIG. 4 is a diagram of example functional components of TCE 210 according to one or more implementations described herein. TCE 210 may include, for example, a user interface 405, a compiler 410, and an executive 415. In other implementations, TCE 210 may include fewer functional components, additional functional components, different functional components, and/or a different arrangement of functional components than those illustrated in FIG. 4. The functions described in connection with FIG. 4 may be performed by the components of user device 205 depicted in FIG. 3.

User interface 405 may include logic to provide an interface that aids a user in creating, compiling, executing, and/or analyzing a model of a system. User interface 405 may provide libraries that include predefined entities that may be used to create the model. Additionally, or alternatively, user interface 405 may permit user-defined entities to be created and used when creating the model. For example, user interface 405 may include predefined blocks and/or permit user-defined blocks to be created and used when creating the model of the system.

Compiler 410 may include logic to provide a transformation of information associated with the model to an alternative form. In one example, compiler 410 may convert the model into an internal representation that allows the executive to execute the model represented by the block diagram in an interpreted mode. In particular, compiler 410 may convert a graphical description embodied by a block diagram into an internal form, allocate data structures for the memory, generate an order of execution, and then execute the pre-written versions of the blocks in the block diagram. Compiler 410 may also convert the model into an internal representation which then allows the generation of code which may then be executed in another executable environment.

For example, compiler 410 may generate code (e.g., executable code, target code, intermediate code, etc.) that corresponds to the model. The code may be generated as a textual language (e.g. C/C++) which will then be further compiled and linked into an executable program directly executable by an operating system, including, but not limited to, an operating system on which TCE 210 may be running. For example, compiler 410 may transform the model into generated code in the form of a hardware description language, which can be used to synthesize custom hardware.

Compiler 410 may perform various operations to generate the code. For example, compiler 410 may prepare data structures, evaluate parameters, configure and propagate component characteristics, determine component connectivity, determine signal compatibility, etc., associated with the model. In one implementation, compiler 410 may convert the model into an executable form, which may be executed. In other implementations, compiler 410 may generate an internal representation of the model for execution in an interpreted mode, and/or compiler 410 may generate textual code for further execution in another environment.

The executable form of the model may include, for example, an executable image, object code, a library, and/or some other form. The executable form of the model may also include code generated in a textual language that is not executable directly by the operating system (e.g., of TCE 210), but runs in another environment (e.g., Java, Perl, MATLAB code, or other interpreted languages). Compiler 410 may permit the user to select a target platform for the generated executable code. Executive 415 may include logic to execute, run, and/or simulate the executable form of the model and output a result (e.g., a simulation) of the executed model.

In other implementations, TCE 210 may also import and/or access a stored model that was created in another environment, such as, but not limited to, another TCE 210. The imported and/or stored model may then be compiled, executed, etc. For example, the Simulink Coder™ software application by The MathWorks, Inc. may generate and execute C and C++ code for models created in the Simulink software application, also by The MathWorks, Inc.

Figure 5:
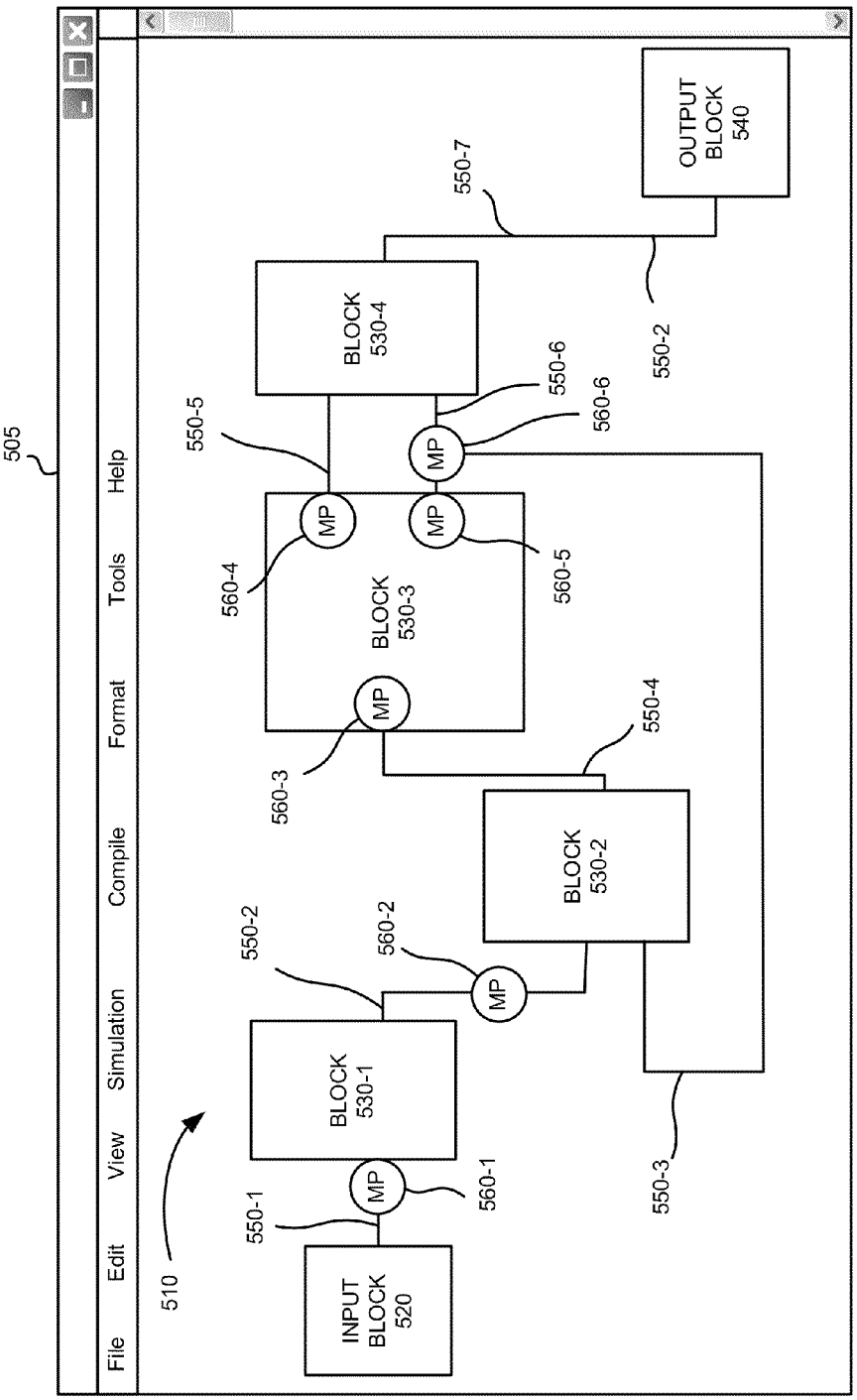
FIG. 5 is an example model in an example graphical user interface (GUI) according to one or more implementations described herein.

FIG. 5 is an example model 510 in an example GUI 505 according to one or more implementations described herein. User interface 405 may provide GUI 505 in which a user may create model 510. Model 510 may include an input block 520, blocks 530-1, 530-2, 530-3, and 530-4 (hereinafter referred to collectively as "blocks 530," and individually as "block 530"), and an output block 540. Input block 520, blocks 530, and output block 540 may be interconnected via connector lines 550-1, 550-2, 550-3, 550-4, 550-5, 550-6, and 550-7 (hereinafter referred to collectively as "connector lines 550," and individually as "connector line 550"). As depicted, model 510 may also, or alternatively, include measurement points 560-1, 560-2, 560-3, 560-4, 560-5, and 560-6 (hereinafter referred to collectively as "measurement points 560," and individually as "measurement point 560").

Input block 520 may represent a block that provides an input signal to model 510 and/or enables block 530-1 to execute part of its function. For example, input block 520 may execute part of its function and directly, or indirectly, cause block 530-1 to execute part of its function, by providing an input signal (e.g., a signal value) to block 530-1 via connector line 550-1. Similarly, block 530-1 may enable block 530-2 to execute part of its function by providing an input signal to block 530-2 via connector line 550-2. However, the type of operation performed by block 530-2 may also, or alternatively, be dependent on an input signal from block 530-3 via connector line 550-3.

Block 530-3 may receive the input signal from block 530-2 and may provide an input signal to block 530-4 via connector line 550-5 and/or via connector line 550-6. Block 530-4 may receive the input signal from block 530-3 and provide an input signal to output block 540 via connector line 550-7. Output block 540 may receive the input signal from block 530-4 and transmit an output signal (not shown in FIG. 5) to another model, another block, a storage medium, a destination device, etc. For instance, output block 540 may cause user device 205, or a component thereof, to generate a representation, such as a simulation, an effect within a simulation, or some other type of representation, based on the output signal.

As depicted, model 510 may include measurement points 560 that enable a characteristic, a condition, or a behavior of block 530 to be measured. As mentioned in the example provided above, where the blocks 530 correspond to electrical circuit components, measurement point 560 may enable a user to take measurements or perform other types of tests corresponding to an electrical current, electrical potential, electrical resistance, electrical continuity, component integrity, or one or more other types of electrical component characteristics of block 530.

Additionally, or alternatively, as illustrated in FIG. 5, measurement point 560 may be located at various positions within model 510. For example, measurement point 560-1 is located at an input of block 530-1, and measurement point 560-2 is located between block 530-1 and block 530-2. Measurement points 560-3, 560-4, and 560-5 are located inside of block 530-3, and measurement point 560-6 is located at a connector line solder joint or branch point that connects a number of lines. Here the solder joint is a "T" joint (e.g., a location where there two connector lines 550 intersect with one another to form a "T"). As such, in one or more implementations, measurement points 560 may be located outside of block 530 and/or inside of block 530. Additionally, or alternatively, measurement points 560 may have a single connection (e.g., a port), two connections (e.g., ports) (such as measurement point 560-2), or multiple connections (e.g., ports) (such as measurement point 560-6).

In some implementations, block 530 may include a sub block that performs a function consistent with the function corresponding to block 530. In such scenarios, measurement point 560 may be included in block 530 by connecting measurement point 560 to the sub block of block 530. In other implementations, measurement point 560 may be outside of block 530. Accordingly, measurement point 560 may be positioned inside of block 530 or outside of block 530.

In one example, a block 530 may include or otherwise correspond to a non-causal modeling function or operation. An example of a non-causal modeling function may include a function, operation, or equation that may be executed in different fashions depending on one or more inputs, circumstances, and/or conditions. Put another way, a non-causal modeling function or operation may include a function, operation, or equation that does not have a predetermined causality. For instance, a non-causal modeling function may include an equation (e.g., X=2Y) that can be used to identify the value of one variable in the equation (e.g., "X") upon receiving an assigned value corresponding to the other variable (e.g., "Y"). Similarly, if the value of the other variable (e.g., "Y") were provided, the equation could also be used to determine the value of the one variable (e.g., "X").

As such, a non-causal modeling function may not, for example, require a certain input or type of input (e.g., the value of a particular variable) in order to produce a valid output or otherwise operate as intended. Indeed, the operation of a non-causal modeling function may vary based on, for example, circumstance, conditions, or inputs corresponding to the non-causal modeling function. Consequently, while the description provided above generally described a directionally consistent signal flow from input block 520 to output block 540, in other implementations, the interactions between blocks 530 may not necessarily be directionally specific or consistent.

For example, while input block 520 provides an input signal to block 530-1 via connection 550-1, block 530-1 may provide an input signal to input block 520 via connection 550-1. In the electrical domain, input block 520 may correspond to a battery and block 530-1 to a resistor. The battery represented by input block 520 may provide an input voltage to drive the voltage drop across the resistor represented by block 530-1 via connection 550-1. The function of the block 530-1 that represents the resistor may then be enabled to compute a current drawn by the resistor. The current may be provided as input to the battery as represented by input block 520 via connection 550-1. The current may be used by part of the function performed by the battery represented by input block 520 to determine a future input voltage.

In some implementations, blocks 530 may also, or alternatively, operate in accordance with one or more rules or policies corresponding to model 510. For instance, if model 510 were intended to behave as an actual, physical system or device, such as an electronic circuit, blocks 530 may be required to operate according to, for example, the laws of physics (also referred to herein as "physics-based rules"). Requiring models and/or model components to operate in accordance with such rules or policies may help ensure that simulations based on such models will operate as intended.

Model 510 is provided for explanatory purposes only. In practice, model 510 may include more blocks, fewer blocks, different blocks, and/or differently arranged blocks. Similarly, model 510 may include different connections between blocks. Additionally, or alternatively, although model 510 is represented as a block diagram, depending on the environment, model 510 may include a different type of diagram, textual representations, hybrid representations, etc.

Figure 6:
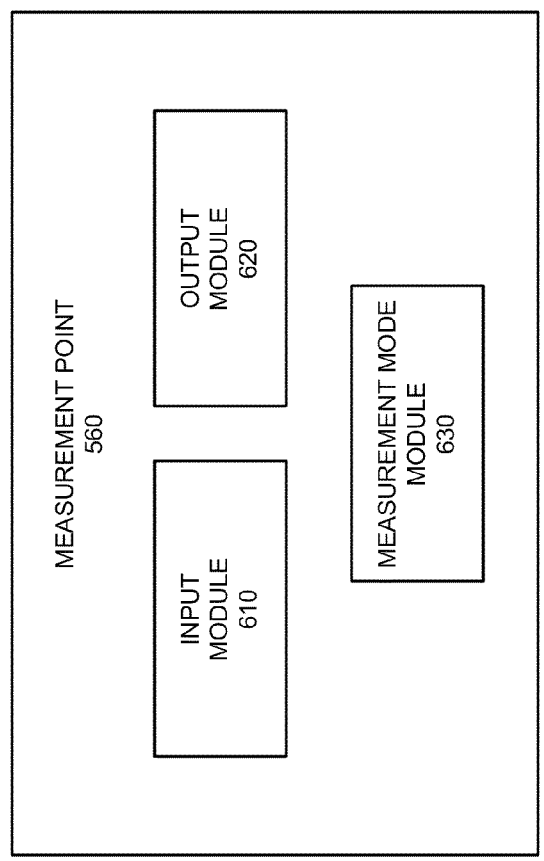
FIG. 6 is a diagram of example functional components of a measurement point according to one or more implementations described herein.

FIG. 6 is a diagram of example functional components of a measurement point according to one or more implementations described herein. As depicted, measurement point 560 may include an input module 610, an output module 620, and a measurement mode module 630. Depending on the implementation, one or more of modules 610-630 may be implemented as a combination of hardware and software based on the components illustrated and described with respect to FIG. 3. Alternatively, modules 610-630 may each be implemented as hardware based on the components illustrated and described with respect to FIG. 3.

Input module 610 may provide functionality with respect to receiving an input signal (e.g., a signal value) or another type of information. For example, input module 610 may enable measurement point 560 to receive an input from block 530, another type of model component, a device, etc. Similarly, output module 620 may provide functionality with respect to providing a signal (e.g., a signal value) or another type of information. For example, output module 620 may enable measurement point 560 to provide or communicate an output to block 530, another type of model component, a device, etc.

Measurement mode module 630 may provide functionality with respect to taking measurements. For example, as mentioned above, measurement point 560 may enable a user to take measurements, conduct tests, or otherwise interact with one or more features in a model and/or a simulation. In some implementations, measurement mode module 630 may enable measurement point 560 to change from one configuration to another configuration to enable a user to take different types of measurements. As mentioned in an example provided above, measurement mode module 630 may enable a user to configure measurement point 560 to measure a voltage, and, at some point thereafter, reconfigure the same measurement point 560 to measure for resistance. Multiple examples are discussed below with reference to FIGS. 9-12.

Measurement point 560 is provided for explanatory purposes only. In addition to the functionality described above, the functional components of measurement point 560 may also, or alternatively, provide functionality as described elsewhere in this description. Further, while FIG. 6 shows a particular number and arrangement of modules, in alternative implementations, measurement point 560 may include additional modules, fewer modules, different modules, or differently arranged modules than those depicted.

Figure 7:
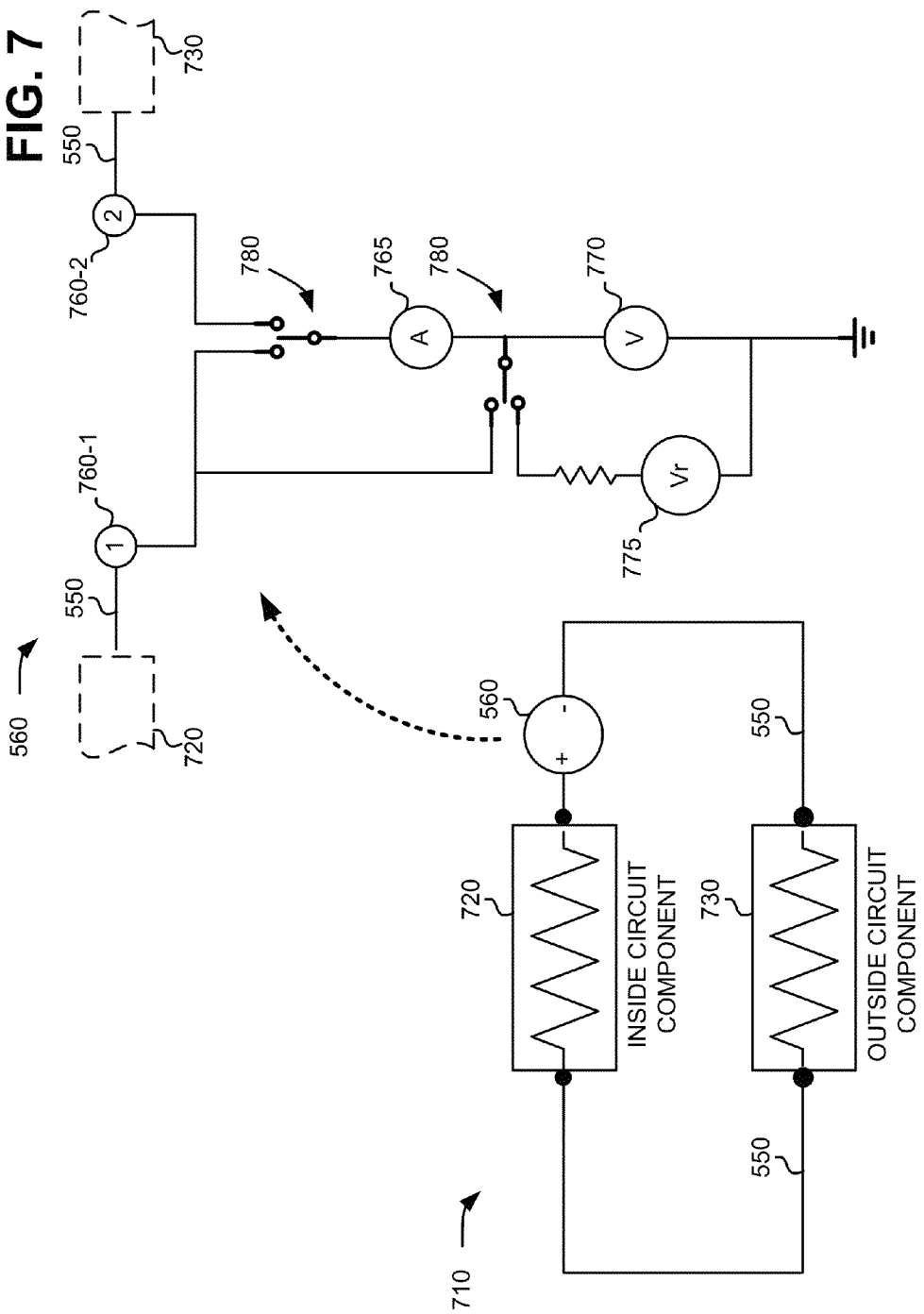
FIG. 7 is a diagram of an example model and an example measurement point according to one or more implementations described herein.

FIG. 7 is a diagram of an example model 710 according to one or more implementations described herein. As depicted, example model 710 includes an inside circuit component 720, an outside circuit component 730, connector lines 550, and a measurement point 560. Measurement point 560 may include connector nodes 760-1 and 760-2 (hereinafter referred to collectively as "connector nodes 760," and individually as "connector node 760"), current sensor 765, voltage sensor 770, voltage source 775, and switches 780.

Model 710 may be viewed as an example of model 510 (discussed above with reference to FIG. 5). For instance, inside circuit component 720 and/or outside circuit component 730 may correspond to one or more blocks 530. Additionally, or alternatively, since model 710 is depicted as a circuit diagram and since measurement point 560 is to test one or more characteristics of model 710, measurement point 560 is also provided as a circuit diagram. However, model 710 and measurement point 560 are provided for explanatory purposes only. In practice, model 710 and/or measurement point 560 may include additional components, fewer components, different components, and/or differently arranged components.

As illustrated in FIG. 7, measurement point 560 may be positioned outside of inside circuit component 720, such that connector lines 550 are connected to connector nodes 760 of measurement point 560. Current sensor 765 may be capable of measuring an electrical current passing through measurement point 560, and voltage sensor 770 may be capable of measuring a voltage of an electrical current passing through measurement point 560.

Voltage source 775 may be capable of introducing a current to measurement point 560 (which may, for example, pass through inside circuit component 720 and/or outside circuit component 730 for measurement purposes). As described below with reference to FIGS. 8-12, current sensor 765, voltage sensor 770, and voltage source 775 may be used to measure various characteristics of inside circuit component 720 and/or outside circuit component 730. In addition, the description provided below with reference to FIGS. 8-12 demonstrate that switches 780 may be used to transition from one measurement mode to another mode in order to measure different characteristics of inside circuit component 720 and/or outside circuit component 730. Thus, a single measurement point 560 may be used to perform various different types of measurements.

Figure 8:
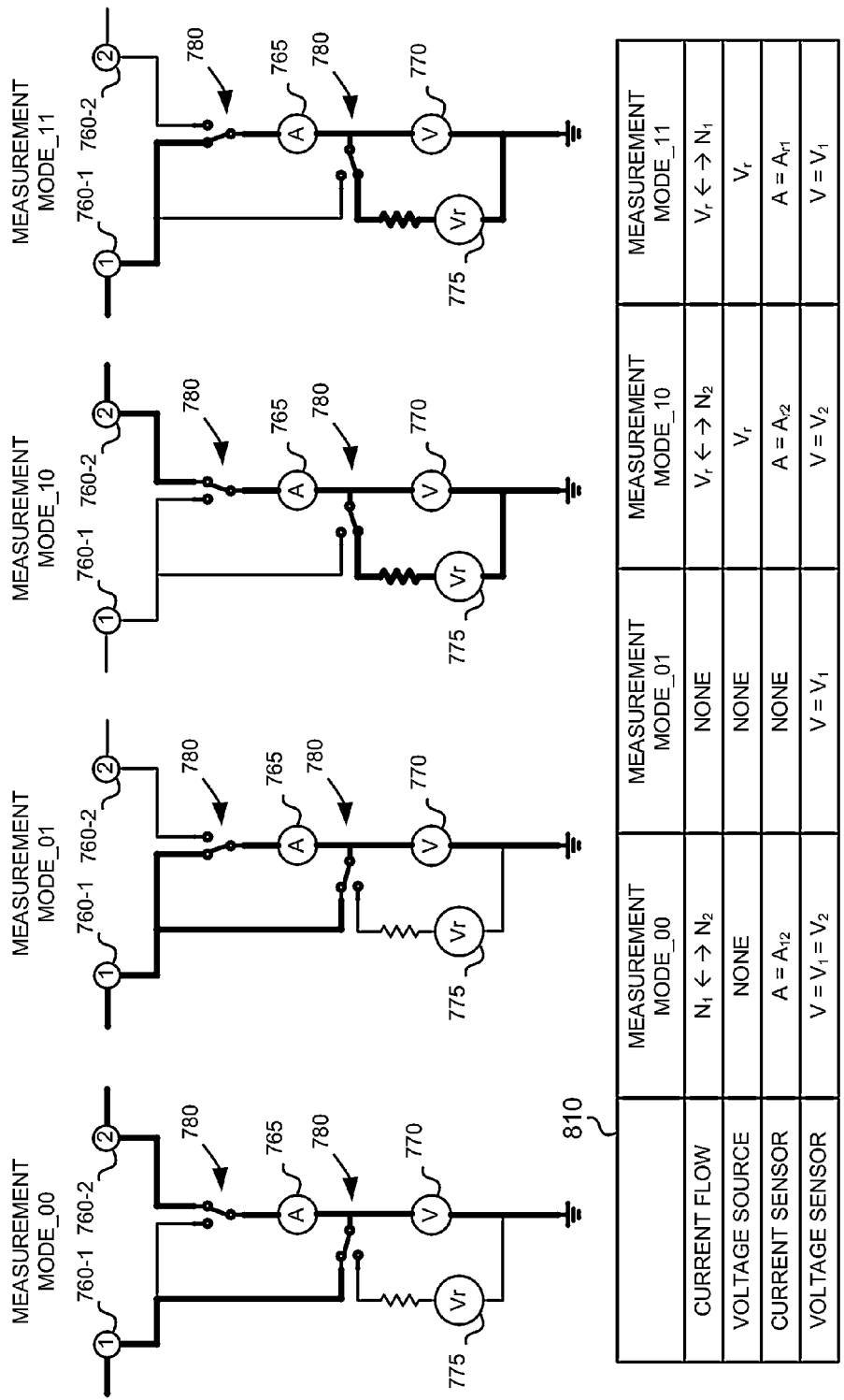
FIG. 8 is a diagram of example measurement point configurations according to one or more implementations described herein.

FIG. 8 is a diagram of example measurement point configurations according to one or more implementations described herein. The measurement point configurations include measurement mode_00, measurement mode_01, measurement mode_10, and measurement mode_11. Characteristics of each of the measurement point configurations are organized in a table 810 depicted in FIG. 8.

In measurement mode_00, switches 780 may be positioned such that an electrical current entering from either connector node 760 may come in contact with current sensor 765 and voltage sensor 770. Voltage source 775 is inactive in measurement mode_00. Thus, in table 810, the current flow entry corresponding to measurement mode_00 is listed as being from connector node 760-1 to connector node 760-2 (e.g., $N_1 N_2$), and the voltage source entry in table 810 is listed as being inactive (e.g., NONE). Table 810 also indicates that the current measured by current sensor 765 may be the current passing though each of connector nodes 760 (e.g., $A=A_{12}$), and the voltage measured by voltage sensor 770 may be the same as the voltage experienced by both connector nodes 760 (e.g., $V=V_1=V_2$).

In measurement mode_01, switches 780 may be positioned such that an electrical current may come in contact with one of connector nodes 760 (e.g., connector node 760-1), current sensor 765, and voltage sensor 770. However, the electrical current may not originate from voltage source 775, and the electrical current may not come in contact with connector node 760-2. Thus, table 810 indicates that there may not be a current flow, voltage source activity, or measurements made by current sensor 765. Table 810 also indicates that the voltage measured by voltage sensor 770 may represent the voltage experienced at connector node 760-1 (e.g., $V=V_1$).

In measurement mode_10, switches 780 may be positioned such that an electrical current being produced by voltage source 775 may come in contact with voltage sensor 770, current sensor 765, and connector node 760-2. As such, table 810 indicates that a current flow may exist between voltage source 775 and connector node 760-2 (e.g., $V_r N_2$), that there may be a voltage source corresponding to voltage source 775 (e.g., $V_r$), that the electrical current measured by current sensor 765 may correspond to an electrical current between current source 775 and connector node 760-2 (e.g., $A=A_{r2}$), and that the voltage measured by voltage sensor 770 may be equal to the voltage passing through connector node 760-2 (e.g., $V=V_2$).

In measurement mode_11, switches 780 may be positioned such that an electrical current produced by voltage source 775 may come in contact with voltage sensor 770, current sensor 765, and connector node 760-1. Thus, table 810 indicates that a current flow may exist between voltage source 775 and connector node 760-1 (e.g., $V_r N_1$), that the voltage source may originate from voltage source 775 (e.g., $V_r$), that the electrical current measured by current sensor 765 may correspond to an electrical current between voltage source 775 and connector node 760-1 (e.g., $A=A_{r1}$), and that the voltage measured by voltage sensor 770 may be equal to the voltage experienced at connector node 760-1 (e.g., $V=V_1$).

Accordingly, each measurement mode may include a distinct measurement point configuration capable of creating a distinct measuring environment and producing a distinct data set. As described below, the measurement modes may be applied in various ways to measure certain qualities or characteristics of inside circuit component 720 and/or outside circuit component 730.

Figure 9:
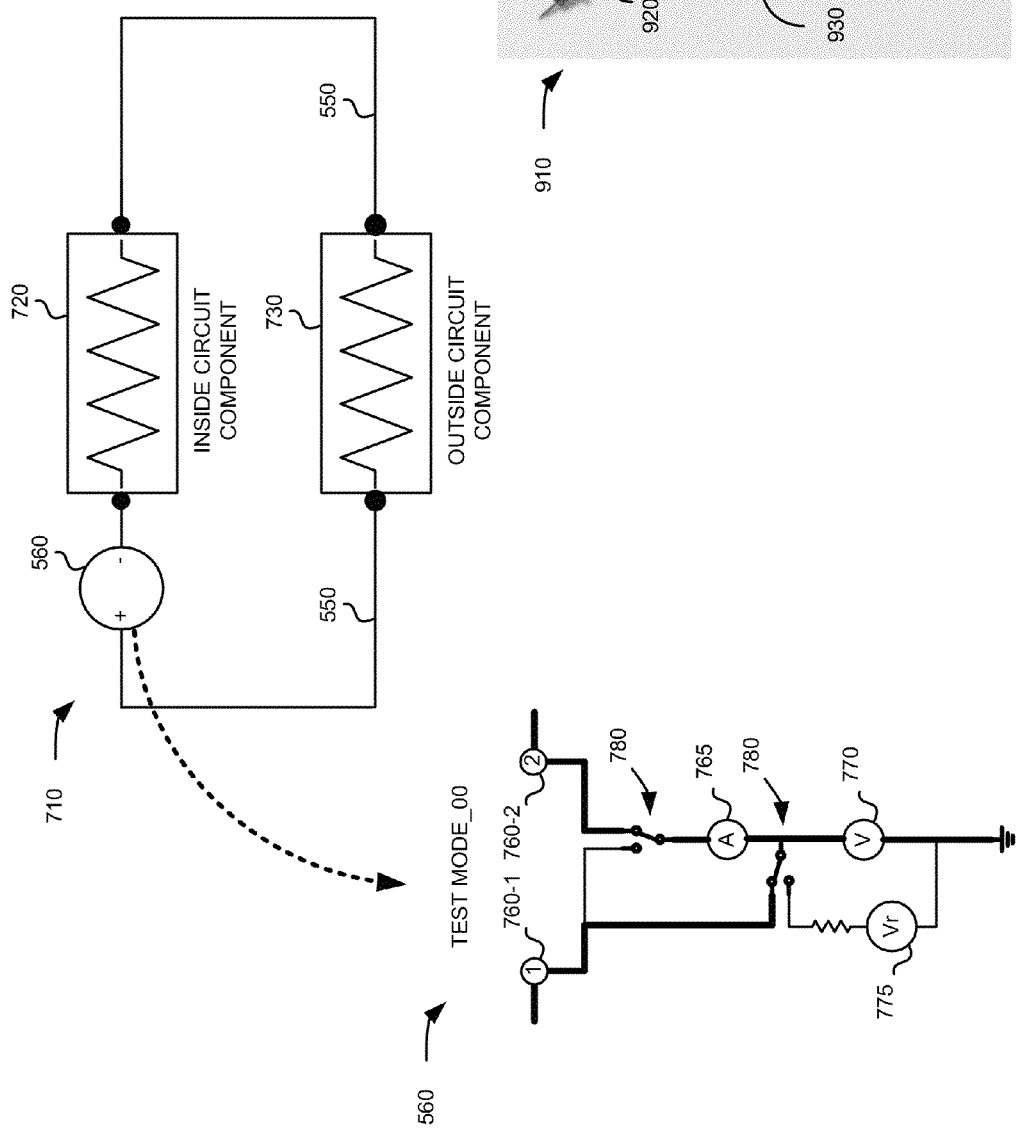

FIG. 9 is a diagram of an example model 710 and a probing device 910 according to one or more implementations described herein. As depicted, model 710 may include inside circuit component 720, outside circuit component 730, measurement point 560, and connector lines 550. Probing device 910 may include probes 920-1 and 920-2, a display 930, and a user input panel 940. In one or more implementations, model 710 and probing device 910 may enable a user of user device 205 to measure characteristics of model 710.

As mentioned above, a simulation, as described herein, may include various combinations of hardware and software components in collaboration with one another. For instance, in some implementations, probing device 910 may be visually represented in a simulation provided by user device 205. In other implementations, however, probing device 910 may be a hardware device that is connected to and/or capable of communicating with user device 205. In such implementations, probing device 910 may be capable of interacting with user device 205 by, for example, coming in contact with sensors connected to user device 205.

As described above, user device 205 may generate a simulation based on model 710. The simulation may include a presentation of electronic circuitry that operates or behaves in accordance with the laws of physics. In some implementations, measurement point 560 may be configured to measure a particular quality, behavior, or other characteristic of model 710. For instance, in the example provided by FIG. 9, measurement point 560 is configured according to measurement mode__00 (see, for example, FIG. 7), which may enable an electrical current to be tested or measured by passing the electrical current throughout model 710 and including current sensor 765.

As such, during the simulation, the user may configure probing device 910 (via user input panel 940) to measure electrical potential. The user may also, or alternatively, configure measurement point 560 such that current sensor 765 may measure the electrical current passing through model 710, and cause the measurement to be presented to the user via display 930, which may be used by the user to help determine whether the electrical circuitry represented by model 710 is operating properly.

FIG. 10 is a diagram of an example model 710 and a probing device 910 according to one or more implementations described herein. Similar to the example discussed above with reference to FIG. 9, model 710 may include inside circuit component 720, outside circuit component 730, and connector lines 550. Also similar to the example discussed above with reference to FIG. 9, probing device 910 may include probes 920-1 and 920-2, display 930, and user input panel 940. However, while the example of FIG. 9 included only one measurement point 560, the example provided in FIG. 10 includes two measurement points 560. The two measurement points 560 of FIG. 10 may enable a user to measure or test for electrical potential with respect to model 710.

For example, during a simulation, a user may determine the electrical potential of the electronic circuitry corresponding to model 710. Since electrical potential may be based on two voltage measurements, the user may identify measurement points 560, within the simulation, for measuring voltage. In some implementations, measurement points 560 may not already be configured to measure voltage, and the user may input one or more commands into user device 205 in order to configure measurement points 560 to operate in a measurement mode (e.g., measurement mode__00) that may measure voltage.

At some point after measurement points 560 are configured to measure voltage, the user may configure probing device 910 (via user input panel 940) to measure electrical potential. Additionally, or alternatively, the user may engage probe 920-1 with a connector node 760 of one measurement point 560 and engage probe 920-2 with a connector node 760 of the other measurement point 760 so that voltage sensors 770 in each measurement point 760 may measure the voltage of the current passing through the electrical circuitry represented by measurement points 560. The voltage measurements may be used to determine the electrical potential corresponding to the electronic circuitry represented by model 710, and the electrical potential may be displayed (via display 930) to the user. As such, FIG. 10 provides an example of using multiple measurement points 560 to test or measure characteristics of a particular model or a particular model component.

FIGS. 11A-11B are diagrams of an example model 710 and a probing device 910 according to one or more implementations described herein. Similar to the example discussed above with reference to FIG. 10, model 710 may include inside circuit component 720, outside circuit component 730, measurement points 560, and connector lines 550. Also similar to the example discussed above with reference to FIG. 10, probing device 910 may include probes 920-1 and 920-2, display 930, and user input panel 940. However, while the example of FIG. 10 included measurement points 560 configured for measurement mode__00, the example provided in FIGS. 11A-11B include one measurement point 560 configured for measurement mode__10 and another measurement point 560 configured for measurement mode__11. As discussed below, the measurements taken at measurement points 560 may depend on the particular configuration (e.g., measurement mode) of one or a combination of measurement points 560.

For instance, during a simulation, a user may decide to determine an electrical resistance corresponding to a particular model component, such as inside circuit component 720. Since electrical resistance may be based on a combination of voltage measurements and electrical current measurements, the user may identify measurement points 560 within the simulation for measuring voltage. As mentioned above, with reference to FIG. 10, in some implementations, measurement points 560 may not already be configured to measure a voltage and an electrical current corresponding to inside circuit component 720, and the user may be required to input one or more commands into user device 205 (via user interface 405) in order to configure measurement points 560 to operate in measurement modes (e.g., measurement mode__10, measurement mode__11, etc.) that will measure voltage and electrical current corresponding to inside circuit component 720.

For instance, in the example of FIG. 11A, one measurement point 560 is configured to operate according to measurement mode__10 and the other measurement point 560 is configured to operate according to measurement mode__11. In the example of FIG. 11A, while the respective measurement modes of measurement points 560 are different, the measurement modes are appropriate since each measurement mode provides for voltage measurements from voltage sensors 770 and electrical current measurements from current sensors 765. Further, the arrangement of measurement modes and measurement points 560 in the example provided by FIG. 11A directs the corresponding electrical current to inside circuit component 720.

At some point after measurement points 560 are configured, the user may configure probing device 910 to determine the electrical resistance based on one or more measurements from current sensors 765 and/or voltage sensors 770. Additionally, or alternatively, the user may engage probes 920 with an appropriate connector node 760 of each measurement point 560, so that the electrical resistance corresponding to inside circuit component 720 may be determined. As such, FIG. 11A provides an example of using multiple measurement points 560 with distinct configurations (e.g., measurement modes) to test or measure a particular model 710 or a particular model component (e.g., inside circuit component 720).

Referring now to FIG. 11B, at some point after testing or measuring the electrical resistance corresponding to inside circuit component 720, the user may decide to test or measure the electrical resistance corresponding to outside circuit component 730. In the example provided in FIG. 11B, transitioning from measuring the electrical resistance corresponding to inside circuit component 720 to measuring the electrical resistance corresponding to outside circuit component 730, may be accomplished by switching the configuration of one measurement point 560 for the configuration of the other measurement point 560 to redirect the electrical current toward outside circuit component 730. At some point after measurement points 560 are reconfigured, the user may engage probes 920 with the appropriate connector nodes 760 (e.g., the connector nodes 760 receiving the electrical current). In some implementations, the measurement mode configuration of measurement points 560 may also enable continuity check with respect to model 510 by comparing a resistance value to a standard or otherwise designated resistance level.

FIG. 12 a diagram of an example model 710 and a probing device 910 according to one or more implementations described herein. Similar to the example discussed above with reference to FIGS. 11A-11B, model 710 may include diode 1220, outside circuit component 730, measurement points 560, and connector lines 550. Also similar to the example discussed above with reference to FIGS. 11A-11B, probing device 910 includes probes 920, display 930, and user input panel 940. As depicted in FIG. 12, inside circuit component 720 has been replaced with diode 1220. The measurement mode configurations of measurement points 560 may be similar to those of FIG. 11A. In the example of FIG. 12, a diode check may be performed by, for example, measuring a voltage with respect to each measurement point 560 and evaluating the voltages with respect to a particular or anticipated voltage threshold. In some implementations, measurement points 560 may be automatically configured (including the injection of energy for some types of measurements) based on settings of probing device 910.

Figure 13:
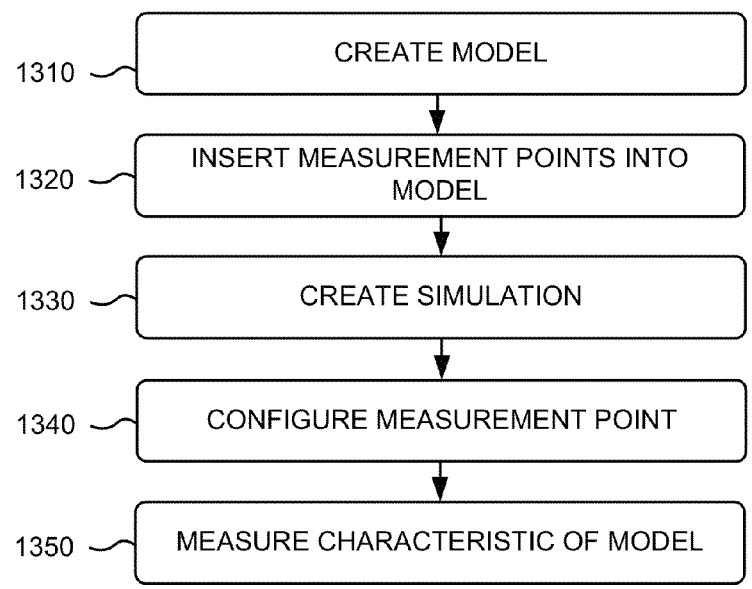
FIG. 13 is a diagram of an example process for measuring a characteristic corresponding to a model component according to one or more implementations described herein.

FIG. 13 is a diagram of an example process for measuring a characteristic of model components according to one or more implementations described herein. In some implementations, process 1300 may be performed by a component of user device 205. In other implementations, a block of process 1300 may be performed by another component/device, or a group of components/devices, including or excluding user device 205.

A model may be created (block 1310). For example, user device 205 may create model 510 using blocks 530 and/or connector lines 550. In some implementations, user device 205 may create model 510 based on inputs from a user. Additionally, or alternatively, user device 205 may create model 510 by, for example, communicating with another computing device and receiving model 510 from the other computing device. Additionally, or alternatively, an existing model may be retrieved, accessed, or loaded, and measurement points may be used in the existing model.

Measurement points may be inserted into model 510 (block 1320). For example, user device 250 may insert measurement point 560 into model 510. In some implementations, user device 205 may insert measurement point 560 in response to a user input. Additionally, or alternatively, measurement point 560 may be incorporated or otherwise included in a particular block 530, and user device 205 may insert measurement point 560 into model 510 in response to, for example, receiving a user input to insert the particular block 530 into model 510. In some implementations, inserting a measurement point into model 510 may include a user identifying a location for inserting measurement point 560 into model 510.

A simulation may be created (block 1330). For instance, user device 205 may create a simulation based on model 510. Similar to the operations discussed above, user device 205 may create the simulation in response to inputs from a user. In some implementations, user device 205 may create the simulation within the same GUI 505, user interface 405, and/or TCE 210 as model 510. Additionally, or alternatively, user device 205 may create an executable data structure (e.g., a .EXE file) that may be executed by user device 205 (or by another computing device) to create the simulation. In some implementations, the simulation may also, or alternatively, be generated in a client/server or other type of network environment.

A measurement point may be configured (block 1340). For example, user device 205 may configure measurement point 560 to operate according to a particular measurement mode. Examples of measurement modes are discussed above with respect to FIG. 8. In some implementations, user device 205 may configure measurement point 560 based on a user input.

A characteristic of the model may be measured (block 1350). For example, a user may interact with user device 205 to measure a characteristic (e.g., a voltage, a current, etc.) corresponding to block 530 of model 510. As mentioned above, in some implementations, the user may measure the characteristic by using a device (e.g., electrical probe 910) that is connected to, or otherwise in communication with, user device 205. Based on the measured characteristics, the user may determine, for example, whether a component of a model and/or simulation is operating properly. In some implementations, measuring a characteristic of the model may be part of interacting with, or performing, the simulation. In some implementations, a model may correspond to field programmable gate arrays (FPGAs) or another type of high-speed circuitry. In such implementations, electrical probe 910 may belong to a virtual logical analyzer. Depending on the implementation, probe 910 may include (or otherwise be implemented using) software and/or hardware.

In some implementations, one or more portions of a particular model 510 or a deployed application may be enabled to execute in a hardware accelerated mode and/or software accelerated mode. For instance, if a particular probe 910 would require, or otherwise benefit from, complex computations (e.g., frequency transformation), then a probe functionality may be accelerated. This acceleration may be implemented by generating software code (that may not rely on an interpreted execution of generated data structures) or by generating hardware code (that can execute on dedicated hardware such as an FPGA).

While FIG. 13 shows a flowchart diagram of an example process 1300 for measuring a characteristic of model components, in other implementations, a process for measuring a characteristic of model components may include fewer operations, different operations, differently arranged operations, or additional operations than depicted in FIG. 13. For example, a user may cause user device 205 to reconfigure measurement point 560 to measure a different characteristic corresponding to model 510.

Additionally, or alternatively, in some implementations, a user may cause user device 205 to create an executable data structure corresponding to model 510 and/or provide the executable data structure to another device in order to, for example, enable the other devices to create or otherwise produce a simulation associated with model 510. In some implementations, the executable data structure may correspond to one or more programming languages (e.g., Structured Text, C, C++, Sequential Function Charts, Function Blocks, a programming language corresponding to a particular standard (e.g., a programming standard associated with the International Electrotechnical Commission (IEC)), etc.), and/or an executable application. In some implementations, the executable data structure may be executed by a program, including a multi-domain simulation or model-based design environment, such as Simulink, Simscape, Stateflow, and/or SimEvents, by The MathWorks, Inc.

Figure 14:
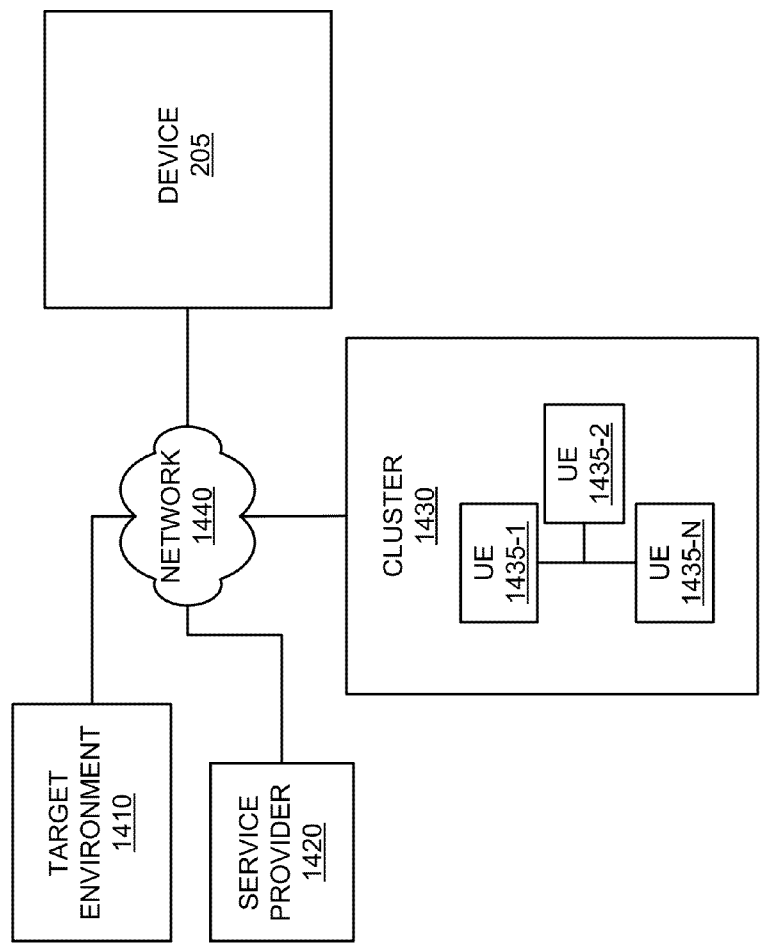
FIG. 14 is a diagram of an example distributed environment in which systems and/or methods described herein may be implemented.

FIG. 14 is a diagram of an example distributed environment 1400 in which systems and/or methods described herein may be implemented. Referring to FIG. 14, environment 1400 may contain various entities including device 205, target environment 1410, service provider 1420, cluster 1430, and network 1440. Note that the distributed environment 1400 is just one example of a distributed environment that may be used with embodiments of the invention. Other distributed environments that may be used with embodiments of the invention may contain more entities, fewer entities, entities in arrangements that differ from the arrangement illustrated in FIG. 14, and so on. Moreover, the distributed environments may be configured to implement various "cloud computing" frameworks.

Details of device 205 were described above with respect to FIG. 2. In distributed environment 1400, device 205 may be configured to, among other things, exchange information (e.g., data) with other entities in environment 1400 (e.g., target environment 1410, service provider 1420, and cluster 1430). Device 205 may interface with the network 1440 via communication interface 370.

Target environment 1410 may be configured to execute and/or interpret a compiled version of a model which may be generated in or otherwise available to the distributed environment 1400. Network 1440 may include a communication network capable of exchanging information between the entities in network 1440. Network 1440 may include digital and/or analog aspects. The information may include machine-readable information having a format that may be adapted for use, for example, in the network 1440 and/or with one or more entities in network 1440. For example, the information may be encapsulated in one or more packets that may be used to transfer the information through network 1440.

Information may be exchanged between entities using various network protocols, such as, but not limited to, the Internet Protocol (IP), Asynchronous Transfer Mode (ATM), Synchronous Optical Network (SONET), the User Datagram Protocol (UDP), Transmission Control Protocol (TCP), Institute of Electrical and Electronics Engineers (IEEE) 802.10, 802.11, etc.

Network 1440 may comprise various network devices, such as gateways, routers, switches, firewalls, servers, repeaters, address translators, etc. Portions of network 1440 may be wired (e.g., using wired conductors, optical fibers, etc.) and/or wireless (e.g., using free-space optical (FSO), radio frequency (RF), acoustic transmission paths, etc.). Portions of network 1440 may include a substantially open public network, such as the Internet. Portions of network 1440 may include a more restricted network, such as a private corporate network or virtual private network (VPN). It should be noted that implementations of networks and/or devices operating on networks described herein are not limited with regards to, for example, information carried by the networks, protocols used in the networks, and/or the architecture/configuration of the networks.

Service provider 1420 may include logic that makes a service available to another entity in distributed environment 1400. Service provider 1420 may also include a server operated by, for example, an individual, a corporation, an educational institution, a government agency, and so on, that provides one or more services to a destination, such as device 205. The services may include software containing computer-executable instructions that implement one or more embodiments of the invention or portions thereof, and may be executed, in whole or in part, by (1) a destination, (2) service provider 1420 on behalf of the destination, or (3) some combination thereof.

For example, in an embodiment, service provider 1420 may provide one or more subscription-based services that may be available to various customers. The services may be accessed by a customer via network 1440. The customer may access the services using a computer system, such as device 205. The services may include services that implement one or more embodiments of the invention or portions thereof. Service provider 1420 may limit access to certain services based on, e.g., a customer service agreement between the customer and service provider 1420.

The service agreement may allow the customer to access the services that may allow the customer to build, execute, and/or analyze a model for a design, as described above. The service agreement may include other types of arrangements, such as certain fee-based arrangements or restricted access arrangements. For example, a customer may pay a fee which provides the customer unlimited access to a given package of services for a given time period (e.g., per minute, hourly, daily, monthly, yearly, etc.). For services not included in the package, the customer may have to pay an additional fee in order to access the services. Still other arrangements may be resource-usage based. For example, the customer may be assessed a fee based on an amount of computing resources and/or network bandwidth used.

Cluster 1430 may include a number of units of execution (UEs) 1435 that may perform processing of one or more embodiments of the invention or portions thereof on behalf of device 205 and/or another entity, such as service provider 1420. UEs 1435 may reside on a single device or chip or on multiple devices or chips. For example, UEs 1435 may be implemented in a single ASIC or in multiple ASICs. Likewise, UEs 1435 may be implemented in a single computer system or multiple computer systems. Other examples of UEs 1435 may include FPGAs, complex programmable logic devices (CPLDs), ASIPs, processors, multiprocessor systems-on-chip (MPSoCs), graphic processing units, microprocessors, etc. UEs 1435 may be configured to perform operations on behalf of another entity. Service provider 1420 may configure cluster 1430 to provide, for example, the above-described services to computing device 205 on a subscription basis (e.g., via a web service).

It will be apparent that example aspects, as described above, may be implemented in many different forms of software, firmware, and hardware in the implementations illustrated in the figures. The actual software code or specialized control hardware used to implement these aspects should not be construed as limiting. Thus, the operation and behavior of the aspects were described without reference to the specific software code—it being understood that software and control hardware could be designed to implement the aspects based on the description herein.

Further, certain implementations may involve a component that performs one or more functions. These components may include hardware, such as an ASIC or a FPGA, or a combination of hardware and software.

Even though particular combinations of features are recited in the claims and/or disclosed in the specification, these combinations are not intended to limit disclosure of the possible implementations. In fact, many of these features may be combined in ways not specifically recited in the claims and/or disclosed in the specification. Although each dependent claim listed below may directly depend on only one other claim, the disclosure of the implementations includes each dependent claim in combination with every other claim in the claim set.

No element, act, or instruction used in the present application should be construed as critical or essential to the implementations unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

As mentioned above, one or more implementations, described herein, may include a TCE. The TCE may permit a user to, for example, perform tasks related to disciplines, such as, but not limited to, mathematics, science, engineering, medicine, and/or business. The TCE may provide one or more environments for modeling a system. For example, the TCE may include a graphical-based environment, a textual-based environment, and/or a hybrid environment (e.g., a combination of graphical and textual environments). The TCE may connect, access, and/or interface with other software applications, data, devices, and/or other types of resources during a modeling process. Concepts described herein are not dependent upon and/or are limited to a particular type of TCE.

Examples of TCEs that may be modified to incorporate one or more embodiments of the invention include, but are not limited to, the MATLAB®, Simulink®, Stateflow®, Simscape™, and SimEvents®, software applications which are available from The MathWorks, Inc., Natick, Mass.; Unified Modeling Language (UML); profiles associated with UML (e.g., Modeling Analysis and Real-Time Embedded Systems (MARTE), Systems Modeling Language (SysML), Avionics Architecture Description Language (AADL)); GNU Octave from the GNU Project; MATRIXx and LabView® from National Instruments; Mathematica from Wolfram Research, Inc.; Mathcad from Mathsoft Engineering & Education Inc.; Maple from Maplesoft; Extend from Imagine That, Inc.; Scilab and Scicos from The French Institution for Research in Computer Science and Control (INRIA); Modelica and Dymola from Dynasim AB; VisSim from Visual Solutions; SoftWIRE from Measurement Computing Corporation; WiT from DALSA Coreco; VEE Pro and SystemVue from Agilent Technologies, Inc.; Vision Program Manager from PPT Vision, Inc.; Khoros from Khoral Research, Inc.; VisiQuest from Pegasus Imaging Corporation; Gedae from Gedae, Inc.; Virtuoso from Cadence Design Systems, Inc.; Rational Rose, Rhapsody, and Tau from International Business Machines (IBM), Inc.; SCADE from Esterel Technologies; the Eclipse development platform from the Eclipse Foundation; MagicDraw from No Magic, Inc.; CoWare from CoWare, Inc.; and Ptolemy from the University of California at Berkeley.

What is claimed is:

1. A method, comprising:
   interacting with a block diagram model comprising a block,
     the block representing a function, and
     the interacting being performed by a computing device;
   receiving information identifying a location in the block diagram model,
     the receiving the information identifying the location being performed by the computing device;
   inserting a measurement point into the block diagram model at the location,
     the inserting being performed by the computing device;
   receiving information identifying an operational characteristic of the function,
     the receiving the information identifying the operational characteristic being performed by the computing device;
   configuring the measurement point to measure the operational characteristic of the function,
     the configuring being performed by the computing device; and
   measuring, during an execution of the block diagram model, the operational characteristic of the function using the measurement point,
     the measuring being performed by the computing device.

2. The method of claim 1, where:
   the measurement point is to operate in a plurality of operational modes, and
   one or more operational modes, of the plurality of operational modes, are to measure a different operational characteristic of the function.

3. The method of claim 2, further comprising:
   configuring the measurement point to operate in an operational mode, of the one or more operational modes, to measure the different operational characteristic of the function,
     where the configuring is performed prior to measuring the different operational characteristic of the function.

4. The method of claim 1, further comprising:
   subsequent to measuring the operational characteristic of the function,
     reconfiguring the measurement point to operate in another operational mode to measure another operational characteristic of the function; and
     measuring the other operational characteristic of the function using the measurement point.

5. The method of claim 1, further comprising:
   inserting another measurement point into the block diagram model to, in combination with the measurement point, cooperatively measure another operational characteristic of the function,
     where the inserting is performed prior to performing a simulation based on the block diagram model.

6. The method of claim 1, where receiving the information identifying the location includes:
   receiving an input for inserting the block into the block diagram model; and where inserting the measurement point includes:
incorporating the measurement point in the block.

7. The method of claim 1, further comprising:
creating an executable data structure corresponding to at least part of the block diagram model,
where the executable data structure is executed by a computing device prior to creating a simulation based on the block diagram model.

8. The method of claim 7, where the executable data structure corresponds to:
a shared library comprising one or more model objects, or
an executable application to create the simulation.

9. The method of claim 1, further comprising:
performing a simulation based on the block diagram model,
where the simulation interacts with at least one of:
analog hardware to interact with the block diagram model, or
digital hardware to interact with the block diagram model.

10. The method of claim 1, where:
a particular software application is used to create the block diagram model, and
the particular software application is used to perform a simulation based on the block diagram model.

11. The method of claim 1, where inserting the measurement point comprises:
connecting, within the block diagram model, the measurement point to the block.

12. The method of claim 1, where:
the block comprises a sub block representing a sub function, and
inserting the measurement point comprises:
connecting the measurement point to the sub block.

13. The method of claim 1, where:
the block diagram model corresponds to an electrical circuit, and
the measuring the operational characteristic of the function comprises one or more of:
measuring a current associated with the block,
measuring an electrical potential associated with the block,
measuring a resistance associated with the block,
checking for continuity corresponding to the block, or
verifying a rectification performance associated with the block.

14. The method of claim 1, where:
the block comprises the measurement point, and
inserting the measurement point into the block diagram model is performed concurrently with inserting the block into the block diagram model.

15. The method of claim 1, where the function comprises:
a non-causal modeling operation that operates in accordance with one or more physics-based rules associated with the block diagram model.

16. The method of claim 1, where the measurement point is connected to measurement equipment.

17. The method of claim 16, where the measurement equipment comprises:
a multimeter to:
measure a voltage,
measure a current, or
measure a resistance.

18. The method of claim 16, where the measurement equipment comprises:
an oscilloscope to measure a voltage over a period of time.

19. The method of claim 16, where the measurement equipment comprises:
a spectrum analyzer to:
measure a signal frequency,
measure a signal magnitude,
measure a harmonic, or
measure a bandwidth.

20. The method of claim 16, where the measurement equipment comprises:
a logic analyzer to obtain performance data.

21. The method of claim 16, where the measurement equipment comprises:
a protocol analyzer to obtain communication channel information.

22. The method of claim 16, where the measurement equipment comprises:
a bit error rate tester to measure a signal quality of a transmission.

23. The method of claim 16, where the measurement equipment comprises:
a counter to obtain event information corresponding to a particular event.

24. The method of claim 16, where the measurement equipment comprises:
data acquisition hardware to:
detect a physical condition, and
produce a digital signal corresponding to the physical condition.

25. The method of claim 1, where the measurement point is automatically configurable based on a setting of a probing device.

26. A computing device, comprising:
a memory; and
a processor, connected to the memory, to:
receive information identifying a location in a block diagram model;
insert a measurement point into the block diagram model at the location to measure an operational characteristic, of a plurality of operational characteristics, of a function represented by a block included in the block diagram model,
the measurement point being to operate in a plurality of operational modes, and
each operational mode, of the plurality of operational modes, being to measure a particular operational characteristic of the plurality of operational characteristics;
receive information identifying the operational characteristic of the function;
configure the measurement point to operate in an operational mode, of the plurality of operational modes, to measure the operational characteristic of the function; and
measure, during an execution of the block diagram model, the operational characteristic of the function using the measurement point.

27. The computing device of claim 26, where the processor is further to:
reconfigure the measurement point to operate in another operational mode to measure another operational characteristic of the plurality of operational characteristics; and
measure the other operational characteristic using the measurement point.

28. The computing device of claim 26, where the block comprises a first block, and where, when receiving the information identifying the location, the processor is to:
receive an input for inserting a second block into the block diagram model,
where the second block includes the measurement point, and
where, when inserting the measurement point into the block diagram model, the processor is to:
insert the second block at the location.

29. The computing device of claim 26, where the processor is to create an executable data structure corresponding to at least part of the block diagram model, and
where the executable data structure is executed by the computing device to create a simulation based on the block diagram model.

30. The computing device of claim 29, where the executable data structure corresponds to:
a shared library comprising one or more model objects, or
an executable application for creating the simulation.

31. The computing device of claim 29, where the simulation interacts with at least one of:
analog hardware to interact with the block diagram model, or
digital hardware to interact with the block diagram model.

32. One or more non-transitory computer-readable storage media storing instructions, the instructions comprising:
one or more instructions that, when executed by a processor, cause the processor to:
receive information identifying a group of locations and information identifying an operational characteristic of a function represented by a block included in a block diagram model;
insert a plurality of measurement points into the block diagram model at the group of locations to cooperatively measure the operational characteristic of the function; and
measure, during an execution of the block diagram model, the operational characteristic of the function using the plurality of measurement points.

33. The one or more non-transitory computer-readable storage media of claim 32, where:
each measurement point, of the plurality of measurement points, comprises a plurality of operational modes, and
each operational mode, of the plurality of operational modes, is to measure an operational characteristic of the function represented by the block.

34. The one or more non-transitory computer-readable storage media of claim 32, where the instructions further comprise:
one or more instructions that, when executed by the processor, cause the processor to:
configure one or more measurement points, of the plurality of measurement points, to operate in an operational mode to cooperatively measure the operational characteristic of the function.

35. The one or more non-transitory computer-readable storage media of claim 34, where the one or more measurement points comprise one or more first measurement points, the instructions further comprising:
one or more instructions that, when executed by the processor, cause the processor to:
reconfigure one or more second measurement points, of the plurality of measurement points, to operate in another operational mode to cooperatively measure another operational characteristic of the function represented by the block; and
measure the other operational characteristic of the function using the plurality of measurement points.

36. The one or more non-transitory computer-readable storage media of claim 32, further comprising:
one or more instructions that, when executed by the processor, cause the processor to:
insert another measurement point into the block diagram model to, in combination with one or more measurement points, of the plurality of measurement points, cooperatively measure another operational characteristic of the function represented by the block.

37. The one or more non-transitory computer-readable storage media of claim 32, where the one or more instructions to receive the information identifying the group of locations and the information identifying the operational characteristic of the function include:
one or more instructions that, when executed by the processor, cause the processor to:
receive an input identifying a location of the block in the block diagram model; and
where the one or more instructions to insert the plurality of measurement points include:
one or more instructions that, when executed by the processor, cause the processor to:
incorporate a measurement point, of the plurality of measure points, into the block.

38. The one or more non-transitory computer-readable storage media of claim 32, where the instructions further comprise:
one or more instructions that, when executed by the processor, cause the processor to:
create an executable data structure corresponding to at least part of the block diagram model,
where the executable data structure is executed by a computing device to create a simulation based on the block diagram model.

39. The one or more non-transitory computer-readable storage media of claim 38, where the executable data structure corresponds to:
a shared library comprising one or more model objects, or
an executable application to create the simulation.

40. The one or more non-transitory computer-readable storage media of claim 38, where the simulation comprises one or more of:
analog hardware to interact with the block diagram model during the execution of the block diagram model, or
digital hardware to interact with the block diagram model during the execution of the block diagram model.

41. The one or more non-transitory computer-readable storage media of claim 32, where:
a particular software application is used to create the block diagram model, and
the particular software application is also used to perform a simulation of a system represented by the block diagram model.

42. The one or more non-transitory computer-readable storage media of claim 32, where the one or more instructions to insert the plurality of measurement points include:
one or more instructions that, when executed by the processor, cause the processor to:
connect, within the block diagram model, a measurement point, of the plurality of measurement points, to the block.

43. The one or more non-transitory computer-readable storage media of claim 32, where the block comprises a sub block representing a sub-function corresponding to the block, and where the one or more instructions to insert the plurality of measurement points include:
one or more instructions that, when executed by the processor, cause the processor to:
connect a measurement point, of the plurality of measurement points, to the sub-block.

44. The one or more non-transitory computer-readable storage media of claim 32, where the block diagram model corresponds to an electrical circuit simulation, and
where the one or more instructions to measure the operational characteristic of the function include:
one or more instructions that, when executed by the processor, cause the processor to one or more of:
measure a current,
measure an electrical potential,
measure a resistance,
check for a continuity, or
verify a rectification performance.

45. The one or more non-transitory computer-readable storage media of claim 32, where the block comprises a measurement point, of the plurality of measurement points, and
where the one or more instructions to insert the plurality of measurement points include:
one or more instructions that, when executed by the processor, cause the processor to:
insert the block into the block diagram model.

46. The one or more non-transitory computer-readable storage media of claim 32, where the function comprises:
a non-causal modeling operation that operates in accordance with one or more physics-based rules associated with the block diagram model.

47. The one or more non-transitory computer-readable storage media of claim 32, where a measurement point, of the plurality of measurement points, is connected to measurement equipment.

48. The one or more non-transitory computer-readable storage media of claim 47, where the one or more instructions to measure the operational characteristic of the function include:
one or more instructions that, when executed by the processor, cause the processor to:
when the measurement equipment includes a multimeter:
measure a voltage,
measure a current, or
measure a resistance,
when the measurement equipment includes an oscilloscope:
measure a voltage over a period of time,
when the measurement equipment includes a spectrum analyzer:
measure a signal frequency,
measure a signal magnitude,
measure a harmonic, or
measure a bandwidth,
when the measurement equipment includes a logic analyzer:
obtain performance data,
when the measurement equipment includes a protocol analyzer:
obtain communication channel information,
when the measurement equipment includes a bit error rate tester:
measure a signal quality of a transmission,
when the measurement equipment includes a counter:
obtain event information corresponding to a particular event, or
when the measurement equipment includes data acquisition hardware:
detect a physical condition, and
produce a digital signal corresponding to the physical condition.

\* \* \* \* \*